United States Patent [19]

Maan

[11] Patent Number: 5,167,744
[45] Date of Patent: Dec. 1, 1992

[54] METHOD OF HERMETICALLY SEALING A SPACE

[75] Inventor: Nicolaus Maan, Eindhoven, Netherlands

[73] Assignee: U.S. Philips Corporation, New York, N.Y.

[21] Appl. No.: 670,379

[22] Filed: Mar. 14, 1991

Related U.S. Application Data

[63] Continuation of Ser. No. 452,849, Dec. 19, 1989, abandoned.

[30] Foreign Application Priority Data

Jan. 9, 1989 [NL] Netherlands ............... 8900042

[51] Int. Cl.⁵ .................. B32B 31/24; C03C 27/12
[52] U.S. Cl. ........................ 156/285; 65/43; 65/157; 156/99; 156/292; 156/381; 156/382; 228/243
[58] Field of Search ............ 156/381, 99, 103, 109, 156/285, 286, 382, 292; 428/1; 65/43, 59.2, 59.23, 157; 228/242, 243

[56] References Cited

U.S. PATENT DOCUMENTS

| | | | |
|---|---|---|---|
| 3,862,830 | 1/1975 | Stern | 65/43 X |
| 3,995,941 | 12/1976 | Nagahara et al. | 65/43 X |
| 4,125,390 | 11/1978 | Kawai et al. | 65/59.23 X |
| 4,277,275 | 7/1981 | Kawamura et al. | 65/43 |
| 4,676,817 | 6/1987 | Tailor | 65/43 |
| 4,836,434 | 6/1989 | Takenaka et al. | 228/179 |
| 4,906,311 | 3/1990 | Gurol | 156/285 X |

FOREIGN PATENT DOCUMENTS 66136 12/1982 European Pat. Off. .

Primary Examiner—Michael W. Ball
Assistant Examiner—Michele K. Yoder
Attorney, Agent, or Firm—Norman N. Spain

[57] ABSTRACT

The invention relates to a method of hermetically sealing a space, more particularly of manufacturing electronic components (9), such as CCD's, LCD's and sensors, mainly consisting of a support (13) and a covering plate (17) enclosing a cavity (19), in which a moisture-sensitive element (15) is arranged and which is hermetically sealed in that the covering plate (17) is secured by means of a thermo-setting glue (5) to the support (13), the operation of curing the thermo-setting glue (5) being carried out in a hermetically sealed chamber (11).

5 Claims, 2 Drawing Sheets

METHOD OF HERMETICALLY SEALING A SPACE

This is a continuation of application Ser. No. 07/452,849, filed Dec. 19, 1989 now abandoned.

BACKGROUND OF THE INVENTION

The invention relates to a method of hermetically sealing a space, in which two or more boundary surfaces of a first space are interconnected by means of a thermo-setting glue and the curing operation is carried out in a second space.

The invention more particularly relates to a method of sealing in a moisture- and gas-tight manner, sensors, CCD's (Charge-Coupled Devices) and LCD's (Liquid Crystal Displays).

A method of the kind to which the present invention relates is known from JP 53-43477 (Kokai).

In this known method, a cavity in a substrate is closed by a covering plate, which plate is connected across the cavity to the substrate by means of a thermo-setting glue. The covering plate is provided with a hole through which gases can escape from the cavity. This is necessary because during the curing operation a pressure is built up in the closed cavity due to the temperature increase and gases tend to escape from the cavity due to this build-up of pressure. The hole is closed afterwards by means of another glue. If the covering plate should be glued to the substrate without being provided with a hole, ducts would be formed in the thermo-setting glue connection during the curing operation due to the escape of gases from the cavity. No hermetically sealing glue connection is then obtained.

Another method of the kind to which the present invention relates is known from JP 58-57879 (Kokai). In this known method, a cavity in a substrate is closed by a covering plate which plate is connected across the cavity to the substrate by means of two kinds of glue. The two glues are provided one beside the other and, after the first glue has cured at room temperature, the second thermo-setting glue is cured at elevated temperature. The gases which tend to escape from the cavity during the curing operation are stopped by the first glue bond and, after the second glue bond has cured, the cavity is sealed hermetically.

A disadvantage of these two methods is that additional laborious operations are necessary to obtain a hermetically sealing thermo-setting glue bond.

A hermetically sealing bond cannot be obtained by means of non-thermosetting glues because these glues are pervious to moisture.

SUMMARY OF THE INVENTION

The invention has for its object to provide a method of the kind described hereinbefore, by which a space is sealed hermetically in a simple manner by means of a thermo-setting glue bond.

According to the invention, this object is mainly achieved by a method in which a first to be hermetically sealed is hermetically enclosed in a second space during the curing operation. Due to this measure, the first space is subjected, during the operation of curing the thermo-setting glue bond connection due to the temperature increase to an inner and an outer increase in pressure, which are substantially equal to each other. Thus, no gases tend to escape from the first space. As a result, no ducts are formed in the glue connection, while the need for additional operations, such as the formation of a hole in a covering plate or the use of two glue connections, have become superfluous.

The second space can be formed by a furnace that can be sealed hermetically. However, a simpler furnace will suffice in an embodiment of the method according to the invention, in which the two spaces are arranged in a furnace before the curing operation. Thus, it is possible to establish a good glue connection by means of a simple furnace and a second space that can be readily sealed hermetically. It is also possible to use a "tunnel" furnace. In this case, the second space may be constituted, for example, by a boiler to be sealed hermetically. These measures lead to a reduction of cost.

In another embodiment of the method according to the invention, the boundary surfaces to be interconnected are clamped on each other during curing. As a result, the boundary surfaces are glued accurately on each other and the boundary surfaces cannot be displaced ("swab") with respect to each other during curing.

The glue may be applied in any arbitrary manner, for example by means of a "dispenser" or by means of a die. However, in a further embodiment of the method according to the invention, the thermo-setting glue is applied by means of silk screen printing to one or more of the boundary surfaces to be interconnected. By this method, the glue can be applied accurately and in a reproducible manner and an aesthetic and reliable glue connection is obtained.

The method according to the invention can be used very advantageously for manufacturing electronic components which mainly consist of a support, a covering plate and a moisture-sensitive element, the moisture-sensitive element being arranged in a cavity which is enclosed by the support and the covering plate, after which the covering plate and the support are interconnected by means of a thermosetting glue and the cavity is sealed hermetically. By the use of the method described above, it is possible to enclose hermetically the moisture-sensitive element in the cavity. This hermetic enclosure is necessary because, when the moisture-sensitive element becomes moist, the electronic component becomes unserviceable.

The invention also relates to an electronic component mainly consisting of a support, a moisture-sensitive element connected to the support, a covering plate arranged over the moisture-sensitive element and connected to the support and a hermetically sealing thermo-setting glue connection between the support and the covering plate obtained by the method according to the invention. The electronic component is characterized by a good hermetically sealing glue connection having an aesthetic and regular appearance and by the absence of features characteristic of the use of more laborious gluing methods.

DETAILED DESCRIPTION OF THE INVENTION

The principle of the method according to the invention will be explained with reference to FIGS. 1 and 2.

Figure 1:
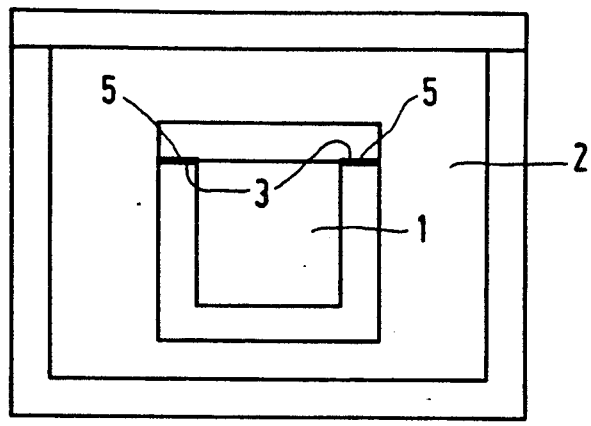
FIG. 1 Shows diagrammatically a space enclosed in another space.

FIG. 1 shows diagrammatically two spaces 1, 2, the first space 1 being hermetically sealed by interconnecting boundary surfaces 3 of the first space 1 by means of a thermosetting glue 5. The operation of curing the thermosetting glue 5 is carried out in a second space 2, which encloses the first space 1 during curing. The temperature and the pressure in the second space 2 before curing are equal to the temperature and the pressure in the first space 1. Also during curing, the temperature in both spaces is substantially equal and because both spaces are sealed hermetically, the pressure in both spaces also remains substantially equal.

Figure 2:
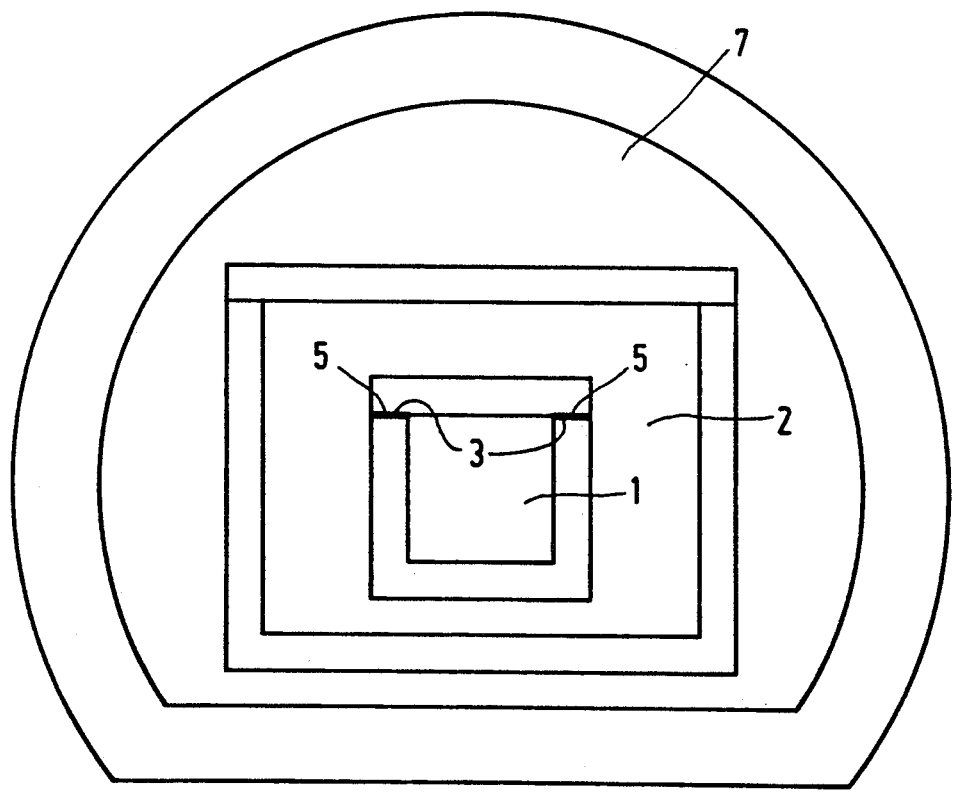
FIG. 2 shows diagrammatically an embodiment of two spaces in a furnace during curing.

FIG. 2 shows diagrammatically an embodiment of two spaces 1, 2 arranged in a furnace 7. The temperatures in the furnace 7 and in the two spaces 1, 2 art substantially equal during curing. The pressure in the furnace 7 deviates during curing from the pressure in the first and second spaces 1, 2. However, the pressure in these spaces 1, 2 remains substantially equal.

Figure 3:
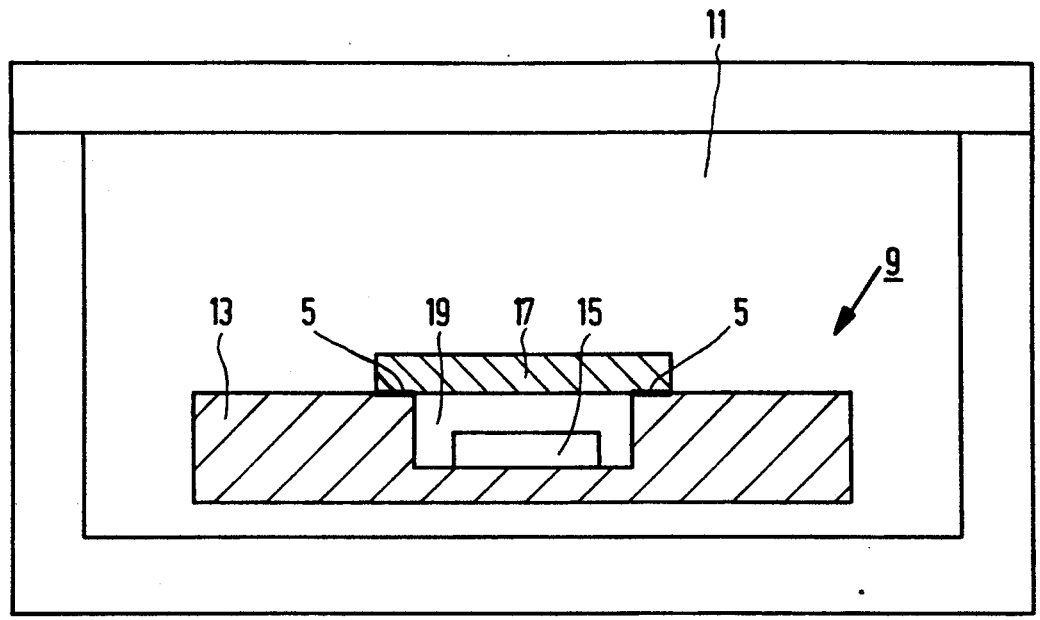
FIG. 3 shows diagrammatically an embodiment of an electronic component in a chamber.

With reference to FIG. 3, the manufacture of an electronic component 9 by means of the method according to the invention will be described with reference to FIG. 3.

FIG. 3 shows diagrammatically an electronic component 9 in a hermetically sealed chamber 11. The electronic component 9, for example a CCD, consists of a support 13, a moisture-sensitive element 15 and a covering plate 17. The covering plate 17 is secured by means of thermosetting glue 5 over the moisture-sensitive element 15 to the support 13. Before curing, the temperature and the pressure in the chamber 11 and in the cavity 19 bounded by the support 13 and by the covering plate 17 are equal. Since the chamber 11 is sealed hermetically, the temperatures and the pressures in the chamber 11 and in the cavity 19 are substantially equal also during curing.

Figure 4:
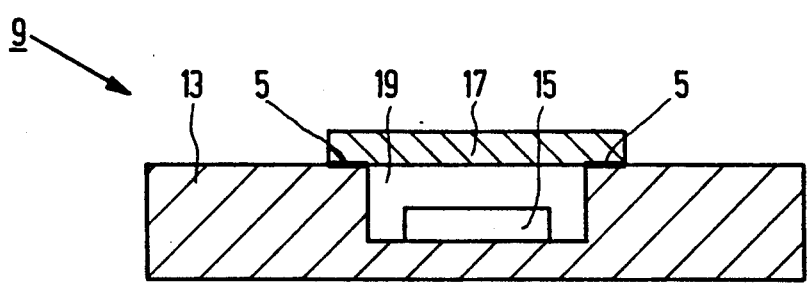
FIG. 4 shows diagrammatically an electronic component manufactured by the method according to the invention.

FIG. 4 shows diagrammatically an electronic component 9 manufactured by the method according to the invention, parts identical to FIG. 3 being provided with the same reference numerals. In this embodiment, the cavity 19 is provided in the support 13 and is closed by a flat covering plate 17.

Figure 5:
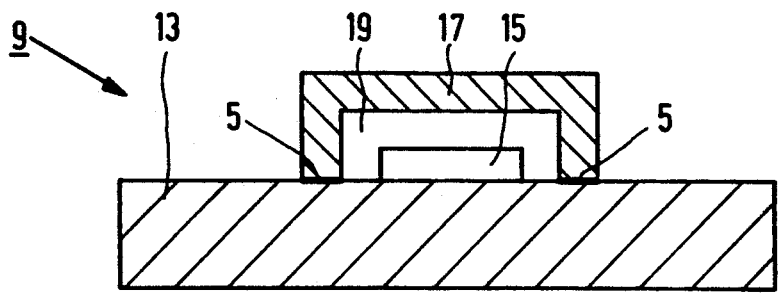
FIG. 5 shows diagrammatically another electronic component manufactured by the method according to the invention.

FIG. 5 shows diagrammatically another electronic component 9 manufactured by the method according to the invention, parts identical to FIG. 3 or 4 being provided with the same reference numerals. In this embodiment, the support 13 is of flat shape, while the covering plate 17 is U-shaped.

I claim:

1. A method of hermetically sealing a first space, which first space has at least two boundary surfaces interconnected by means of a cured thermosetting glue, said method comprising applying a thermosetting glue to opposing portions of boundary surfaces of said first space, positioning said first space in a second space while both first and second spaces are at atmospheric pressure, hermetically sealing said second space under conditions such that said first space and said second space are at the same pressure and temperature and heating the resultant arrangement of said first space and said hermetically sealed second space to thereby cure said thermosetting glue and to hermetically seal said first space, the temperature and pressure in said first space being substantially equal to the temperature and pressure in said second space during said curing.

2. A method as claimed in claim 1, characterized in that the two spaces are arranged in a furnace before curing.

3. A method as claimed in claim 1, characterized in that the boundary surfaces to be interconnected are clamped to each other during curing.

4. A method as claimed in claim 1, characterized in that the thermosetting glue is applied by means of silk screen printing to one or more of the boundary surfaces to be interconnected.

5. A method of manufacturing an electronic component consisting essentially of a support, a covering plate and a moisture-sensitive element, the moisture-sensitive element being arranged in a cavity enclosed by the support and the covering plate, after which the covering plate and the support are interconnected by means of a thermosetting glue, wherein the cavity is hermetically sealed by the steps of positioning said cavity in a space while both the cavity and the space are at atmospheric pressure, hermetically sealing said space under conditions such that said cavity and said space are at the same pressure and temperature and heating the resultant arrangement of said cavity and said hermetically sealed second space to thereby cure said thermosetting glue and to hermetically seal said cavity, the temperature and pressure in said cavity being substantially equal to the temperature and pressure in said space during said curing.

* * * * *